United States Patent
Yan et al.

(10) Patent No.: US 9,236,518 B2
(45) Date of Patent: Jan. 12, 2016

(54) SENSOR AND METHOD FOR FABRICATING THE SAME

(71) Applicant: BEIJING BOE OPTOELECTRONICS TECHNOLOGY CO., LTD., Beijing (CN)

(72) Inventors: Changjiang Yan, Beijing (CN); Zhenyu Xie, Beijing (CN); Shaoying Xu, Beijing (CN); Tiansheng Li, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/128,833

(22) PCT Filed: Dec. 3, 2012

(86) PCT No.: PCT/CN2012/085760
§ 371 (c)(1),
(2) Date: Dec. 23, 2013

(87) PCT Pub. No.: WO2014/015607
PCT Pub. Date: Jan. 30, 2014

(65) Prior Publication Data
US 2014/0231804 A1  Aug. 21, 2014

(30) Foreign Application Priority Data
Jul. 26, 2012  (CN) .......................... 2012 1 0262964

(51) Int. Cl.
*H01L 29/04* (2006.01)
*H01L 31/105* (2006.01)
(Continued)

(52) U.S. Cl.
CPC ........ *H01L 31/1055* (2013.01); *H01L 27/1214* (2013.01); *H01L 27/14603* (2013.01);
(Continued)

(58) Field of Classification Search
USPC .................................. 257/292; 438/149–166
See application file for complete search history.

(56) References Cited

U.S. PATENT DOCUMENTS

2007/0285411 A1    12/2007   Yang et al.
2009/0026509 A1*   1/2009   Hayashi et al. ............... 257/292
(Continued)

FOREIGN PATENT DOCUMENTS

CN    101086998 A    12/2007
CN    101308856 A    11/2008
(Continued)

OTHER PUBLICATIONS

International Search Report Issued Dec. 17, 2012 Appln. No. PCT/CN2012/085760.
(Continued)

*Primary Examiner* — Cheung Lee
*Assistant Examiner* — Frederick B Hargrove
(74) *Attorney, Agent, or Firm* — Ladas & Parry LLP

(57) ABSTRACT

A sensor and its fabrication method are provided, the sensor includes: a base substrate, a group of gate lines and a group of data lines arranged as crossing each other, and a plurality of sensing elements arranged in an array and defined by the group of gate lines and the group of data lines, each sensing element including a TFT device and a photodiode sensing device, wherein a channel region of the TFT device is inverted and the source and drain electrodes are positioned between the active layer and the gate electrode. The sensor reduces the number of mask as well as the production cost and simplifies the production process, thereby significantly improves the production capacity and the defect-free rate.

20 Claims, 3 Drawing Sheets

(51) Int. Cl.
  *H01L 27/146* (2006.01)
  *H01L 27/12* (2006.01)
  *H01L 29/66* (2006.01)
  *H01L 29/786* (2006.01)
  *H01L 31/0256* (2006.01)

(52) U.S. Cl.
  CPC .... *H01L27/14689* (2013.01); *H01L 29/66765* (2013.01); *H01L 29/78669* (2013.01); *H01L 31/0256* (2013.01)

(56) References Cited

U.S. PATENT DOCUMENTS

| | | | |
|---|---|---|---|
| 2009/0146138 A1 | 6/2009 | Aoki | |
| 2010/0091149 A1* | 4/2010 | Weisfield et al. | 348/294 |
| 2010/0163882 A1* | 7/2010 | Jung | 257/59 |
| 2010/0200859 A1* | 8/2010 | Joo et al. | 257/59 |
| 2011/0266599 A1* | 11/2011 | Ishida et al. | 257/292 |

FOREIGN PATENT DOCUMENTS

| | | |
|---|---|---|
| CN | 101459221 A | 6/2009 |
| CN | 102790067 A | 11/2012 |

OTHER PUBLICATIONS

First Chinese Office Action Issued May 30, 2014 Appln. No. 201210262964.4.

International Preliminary Report on Patentability dated Jan. 27, 2015; PCT/CN2012/085760.

* cited by examiner

SENSOR AND METHOD FOR FABRICATING THE SAME

FIELD OF THE ART

Embodiments of the invention relate to a sensor and a method for fabricating the same.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is sensor.

FIG. 1 illustrates a basic configuration of a sensor. The sensor 12 comprises a plurality of scan lines 15, a plurality of data lines 16 and a plurality of sensing elements, each of sensing elements comprises a photodiode 13 and a field effect transistor (FET) 14. The gate of the FET 14 is connected with a corresponding scan line 15 of the sensor 12, the drain of the FET 14 is connected with a corresponding data line 16 of the sensor, and the source of the FET 14 is connected with the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected with the FET 14 and the data readout circuit 18, and capturing of the photocurrent signal is realized by controlling signal timing on the scan line 15 and the data line 16. That is to say, the capturing of the photocurrent signal is controlled by controlling the ON/OFF state of the FET 14.

Currently, sensors generally employ a thin film transistor (TFT) plate configuration. Such a sensor may have many layers in its cross section, for example, each sensing element comprises a substrate, a gate electrode layer, a gate insulating layer, an active layer, a source electrode and a drain electrode layer, a passivation layer, PIN junction of the PIN photosensor and transparent electrode window layer, and a bias line layer as well as a light-shield strip layer. Detailed patterning layers may differ from each other for different sensors, depending on the specific configuration of the sensors.

Individual patterning layers of the sensor are generally formed via patterning processes and each patterning process generally comprises steps of exposing by a mask, developing, etching and peeling. That is to say, multiple patterning processes are needed to realize multiple patterning layers of the sensor. For example, 9 to 11 patterning processes are needed to form a multi-layer sensor as described above, thereby 9 to 11 masks are required, which makes the fabrication cost high and the process complicated and the production capacity difficult to increase.

SUMMARY

The invention aims to provide a sensor and its fabrication method so as to overcome the technical problems of sensors having high production cost and complicated fabrication processes and difficulty in improving the production capacity.

A first aspect of the invention provides a sensor, comprising: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein:

the TFT device comprises: a gate electrode disposed on the base substrate and connected with a gate line; a gate insulating layer disposed on the gate electrode and overlaying the base substrate; a source electrode and a drain electrode disposed on the gate insulating layer and opposed to each other to form a groove, wherein the drain electrode is connected with a data line; an ohmic layer disposed on the source electrode and the drain electrode, and an active layer disposed on the ohmic layer and in the groove;

the photodiode sensing device comprises: a receiving electrode disposed on the gate insulating layer and connected with the source electrode, a photodiode (PD) disposed on the receiving electrode, a transparent electrode disposed on the PD and a bias line disposed over the transparent electrode and connected with the transparent electrode.

A second aspect of the invention provides a method for fabricating a sensor comprising:

forming a pattern of a gate line and a pattern of a gate electrode connected with the gate line on a base substrate, using a first patterning process;

forming a gate insulating layer overlaying the base substrate, and forming a pattern of a source electrode and a drain electrode which are disposed on the gate insulating layer and opposed to each other to form a groove, a pattern of a receiving electrode connected with the source electrode, and a pattern of an ohmic layer disposed on the source electrode and the drain electrode, using a second patterning process;

forming a pattern of an active layer on the ohmic layer and in the groove, a pattern of a PD on the receiving electrode and a pattern of a transparent electrode on the PD, using a third patterning process;

forming a pattern of a first passivation layer and a pattern of a third via hole in the active layer and the ohmic layer, using a fourth patterning process, wherein the first passivation layer has a first via hole over the drain electrode and a second via hole over the transparent electrode, and a position of the third via hole corresponds to that of the first via hole; and forming a pattern of a data line that is positioned on the first passivation layer and connects with the drain electrode through the first via hole and the third via hole, and a pattern of a bias line that is positioned on the first passivation layer and connects with the transparent electrode through the second via hole, using a fifth patterning process.

In the sensor according to the embodiment of the invention, the channel region of the TFT device is inverted, the source electrode and the drain electrode are positioned between the active layer and the gate electrode, and the sensor is formed less patterning processes. In comparison with the conventional technology, it reduces the number of mask as well as the production cost and simplifies the production process, thereby significantly improves the production capacity and the defect-free rate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 schematically illustrates a three dimension (3-D) configuration of a conventional sensor.

NUMERAL REFERENCES

Figure 1:
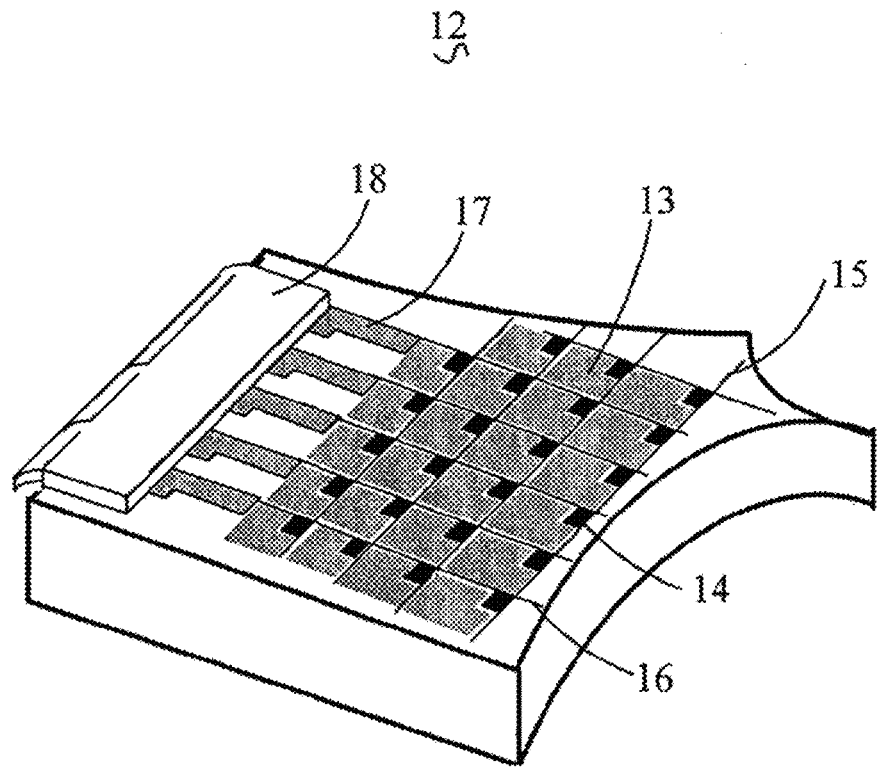

12: sensor;
13: photodiode;
14: field effect transistor (FET)
15: scan line
16: data line
17: connecting pin
18: data readout circuit
30: gate line
31: data line
32: base substrate
33: source electrode
34: drain electrode
35: ohmic layer
36: active layer
37: gate insulating layer
38: gate electrode
39: receiving electrode
40: photodiode
41: transparent electrode
57: second passivation layer
40a: N-type semiconductor
40c: P-type semiconductor
43: first passivation layer
42: bias line
43a: first via hole
43b: second via hole
403a: third via hole
401b: first part of I-type semiconductor
402b: second part of I-type semiconductor

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the invention described below, a sensor may be an X-ray sensor or other type of sensors, such as a sensor for transmitting signals via photo-electric conversion. The following descriptions and drawings are directed to a single sensing element, though other sensing elements may be formed in the same way.

Embodiments of the invention provide a sensor and its fabrication method to address the technical problems of sensors high fabrication cost and complicated fabrication processes in the conventional art.

Figure 2A:
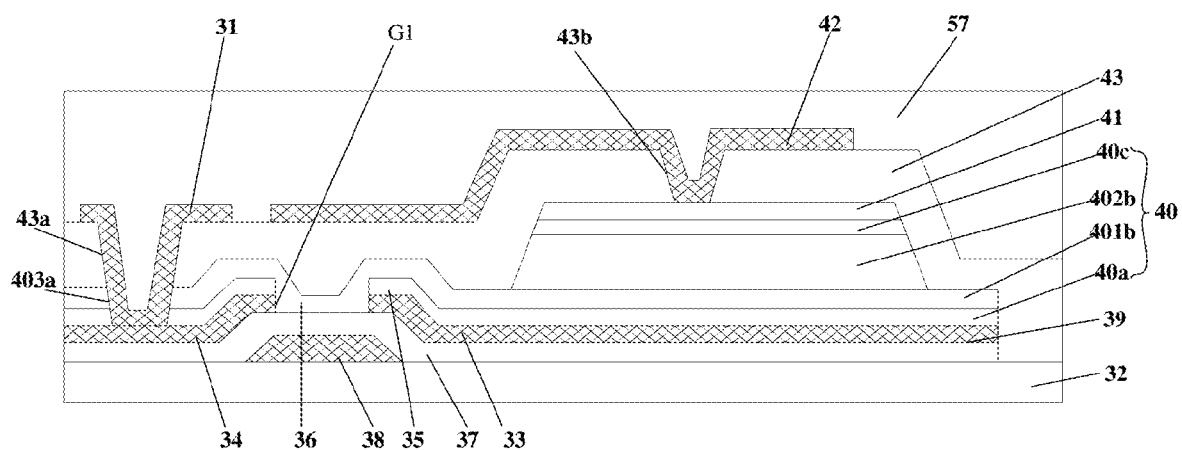
FIG. 2a schematically illustrates a cross section of a sensing element (after six patterning processes) of a sensor in accordance with an embodiment of the invention.
Figure 2B:
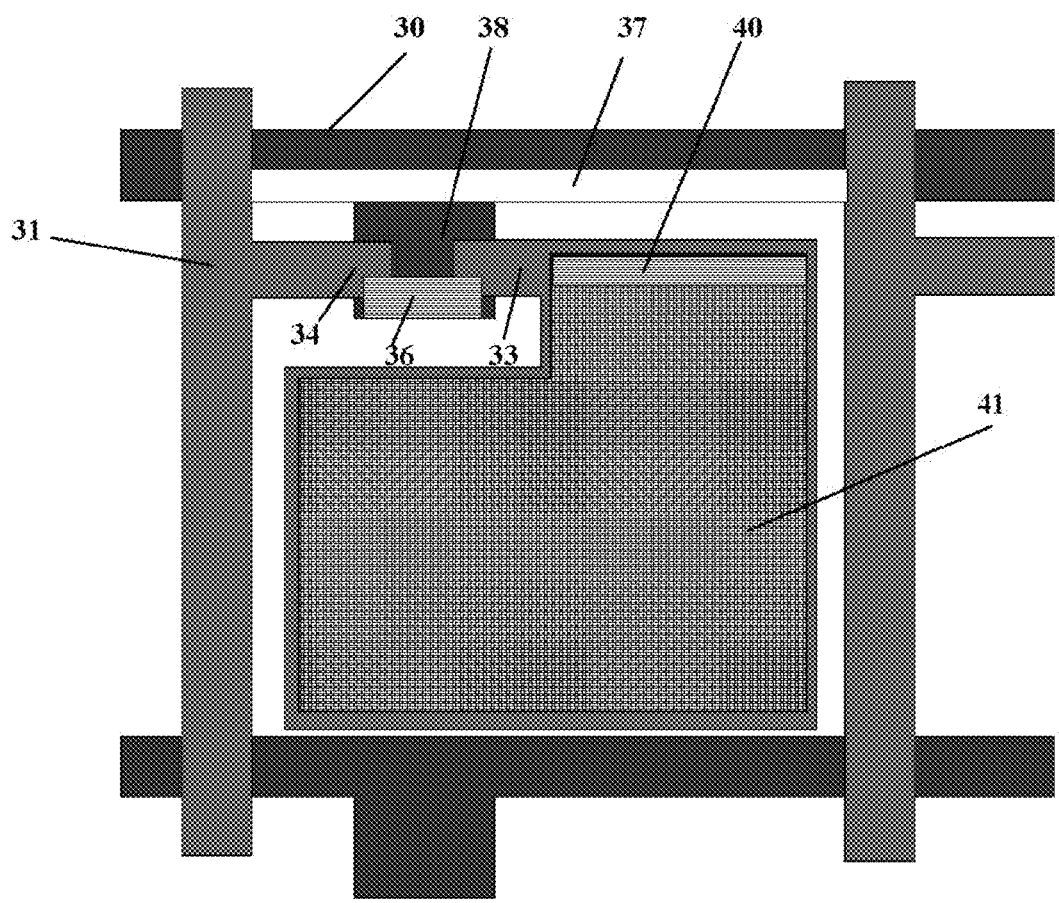
FIG. 2b is a top view of a sensing element of a sensor in accordance with an embodiment of the invention.

FIG. 2a and FIG. 2b are a cross section and a top view of a sensing element of a sensor in accordance with an embodiment of the invention, respectively. As illustrated in FIGS. 2a and 2b, the sensor comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises a TFT device and a photodiode sensing device, in which:

The TFT device comprises: a gate electrode 38 disposed on the base substrate and connected with a gate line 30; a gate insulating layer 37 disposed on the gate electrode 38 and overlaying the base substrate; a source electrode 33 and a drain electrode 34 disposed on the gate insulating layer 37 and opposed to each other to form a groove G1, where the drain electrode 34 is connected with a data line 31; an ohmic layer 35 disposed on the source electrode 33 and the drain electrode 34; and an active layer 36 disposed on the ohmic layer 35 and in the groove G1.

Herein, a portion of the active layer 36 which is positioned between the source electrode 33 and the drain electrode 34 is configured to form a channel region.

The photodiode sensor device comprises: a receiving electrode 39 disposed on the gate insulating layer 37 and connected with the source electrode 33; a photodiode (PD) 40 disposed on the receiving electrode 39; a transparent electrode 41 disposed on the PD 40; and a bias line 42 disposed over the transparent electrode 41 and connected with the transparent electrode 41.

In an embodiment of the invention, the base substrate 32 may be a glass substrate, a plastic substrate or a substrate made of other materials; the gate line 30, the gate electrode 38, the date line 31, the source electrode 33, the drain electrode 34, the receiving electrode 39 and the bias electrode 42 may be a single layer film made of aluminum neodymium (AlNd) alloy, aluminum (Al), copper (Cu), molybdenum (Mo), molybdenum tungsten (MoW) alloy or chromium (Cr), or a multi-layer film made of any combination of these metal elements or alloy materials. The single layer or multi-layer film may have a thickness of for example 150 nm to 450 nm.

In an embodiment of the invention, a material of the ohmic layer 35 may be for example a doped semiconductor (n+a-Si); a material of the active layer 36 may be a semiconducting material, such as, amorphous silicon (a-Si), with a thickness of 30 nm to 250 nm; a material of the gate insulating layer 37 may be silicon nitrides with a thickness of 300 nm to 500 nm; a material of the transparent electrode 41 may be transparent conductive materials such as indium tin oxides (ITO) or indium zinc oxides (IZO).

In an embodiment of the invention, the photodiode may be a PIN photodiode as illustrated in FIG. 2a and comprises: an N-type semiconductor (n+a-Si) 40a, a first part of an I-type semiconductor (a-Si) 401b, a second part of the I-type semiconductor (a-Si) 402b and a P-type semiconductor (p+a-Si) 40c, where the N-type semiconductor 40a is positioned on the receiving electrode 39 and is in the same pattern layer as the ohmic layer 35, the first part of I-type semiconductor 401b is positioned on the N-type semiconductor 40a and is in the same pattern layer as the active layer 36, the second part of the I-type semiconductor 402b is positioned on the first part of the I-type semiconductor 401b, the P-type semiconductor 40c is positioned on the second part of the I-type semiconductor 402b. A PIN photodiode has the advantages of having small junction capacitance, short transit time and high sensitivity. In other configurations of the invention, the photodiode may be a MIS (Metal-insulator-semiconductor)-type photodiode and the like.

Still referring to FIG. 2a, in an embodiment, the sensor may further comprises: a first passivation layer 43 disposed on the transparent electrode 41 and overlaying the base substrate, where the first passivation layer 43 has a first via hole 43a and the active layer 36 and the ohmic layer 35 has a third via hole 403a located at a position corresponding to the first via hole 43a. The disposition of the via holes 43a and 403a exposes a part of the drain electrode 34 located under the two via holes, such that the data line 31 located on the first passivation layer 43 (or overlaying the first passivation layer 43) is connected with the drain electrode 34 through the first via hole 43a and the third via hole 403a. More specifically, the data line 31 is extended and overlays inner walls of the via holes 43a and 403a as well as the exposed part of the drain electrode 34. The first passivation layer 43 may further comprise a second via hole 43b, which is disposed to expose a part of the transparent electrode located under the via hole 43b, such that the bias line 42 on the first passivation layer 43 (or overlaying the first passivation layer 43) is connected with the transparent electrode 41 through the second via hole 43b. More specifically, the bias line 42 is extended and overlays an inner wall of the via hole 43b and the exposed part of the transparent electrode 41.

The sensor may further comprise a second passivation layer 57 disposed on the data line 31 and the bias line 42 and overlaying the base substrate. The second passivation layer 57 has a signal-transmitting region via hole (FIGS. 2a and 2b illustrate a schematic configuration of a sensing element, therefore, the signal-transmitting region via hole at the peripheral of the base substrate is not shown).

The first passivation layer 43 and the second passivation layer 57 may be made of an inorganic insulating film (such as silicon nitrides) or an organic insulating film (such as a photosensitive resin material or a non-photosensitive resin) with a thickness of, for example, 1000 nm to 2000 nm. The first passivation layer 43 and the second passivation layer 57 are provided to make the whole base substrate flattened and to form signal connection via holes therein. In comparison with conventional technologies, the pattern of the first passivation layer 43 and the second passivation layer 57 is similarly formed via a single patterning process. In other embodiment of the invention, the data line 31 and the source electrode 33 as well as the drain electrode 34 can also be formed using the same and one patterning process. In this case, the via hole 43a in the first passivation layer 43 may be omitted and the third via hole 403a in the active layer 36 and the ohmic layer 35 may be omitted, though it still needs a patterning process to form the second via hole 43b in the first passivation layer 43.

In an embodiment of the invention, the source electrode 33, the drain electrode 34 and the receiving electrode 39 are preferably made of the same material. The data line 31 and the bias line 42 are preferably made of the same material. As an example, for the purpose of reducing the number of patterning processes, the two pattern layers (that is, the pattern layer comprising the source electrode 33, the drain electrode 34 and the receiving electrode 39 and the pattern layer comprising the data line 31 and the bias line 42) may be made of the same material.

In the sensor proposed by the invention, the channel region of the TFT device is inverted, the source electrode and the drain electrode are positioned between the active layer and the gate electrode, and the sensor is formed using six patterning processes in total. In comparison with the conventional technology, it reduces the number of used mask as well as the production cost and simplifies the production process, thereby significantly improving the production capacity and the defect-free rate.

Figure 3:
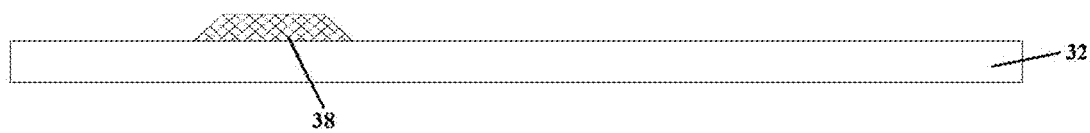
FIG. 3 schematically illustrates a cross section of a sensing element, after a first patterning process, of a sensor in accordance with an embodiment of the invention.

In accordance with another embodiment of the invention, there is provided a method for fabricating the above sensor. The method comprises:

Step 101: a patterning process is used to form, on the base substrate 32, a pattern of the gate line 30 and a pattern of the gate electrode 38 connected with the gate line 30. A cross section after the first patterning process is illustrated in FIG. 3 (in which the gate line 30 is not shown).

A patterning process sequentially comprises steps of substrate cleaning, film forming, photoresist application, exposure, developing, etching, photoresist removal and so on. The substrate may be cleaned using de-ionized water or an organic cleanser. The film forming process is to form the structural layers to be patterned. For example, a metal layer is generally formed using Physical Vapor Deposition (PVD), such as magnetron sputtering, and then wet etched to form a pattern. While a non-metal layer is usually formed using Chemical Vapor Deposition (CVD) and then dry etched to form a pattern. Patterning processes in the following steps are the same and will not be described.

Figure 4:
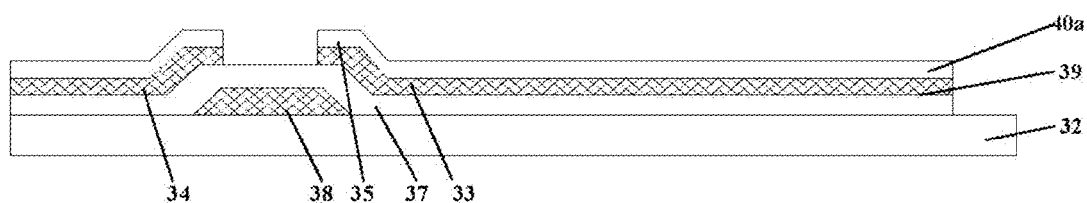
FIG. 4 schematically illustrates a cross section of a sensing element, after a second patterning process, of a sensor in accordance with an embodiment of the invention.

Step 102: the gate insulating layer 37 overlaying the base substrate is formed, and then a patterning process is used to form a pattern of the source electrode 33 and the drain electrode 34 which are on the gate insulating layer 37, and are disposed as opposed to each other over the gate electrode 38 to form the groove, a pattern of the receiving electrode 38 connected with the source electrode 33 and a pattern of the ohmic layer 35 on the source electrode 33 and the drain electrode 34. A cross section after the second patterning process is illustrated in FIG. 4.

In the step, the source electrode 33, the drain electrode 34 and the receiving electrode 39 are of the same material and may be in a single deposition. The ohmic layer 35 and the N-type semiconductor 40a are of the same material n+a-Si (proportions of the ingredients may be adjusted depending on the fabrication processes), thus, the N-type semiconductor 40a in the same layer as the ohmic layer 35 and on the receiving electrode 39 may be formed at the same time with the ohmic layer 35.

Figure 5:
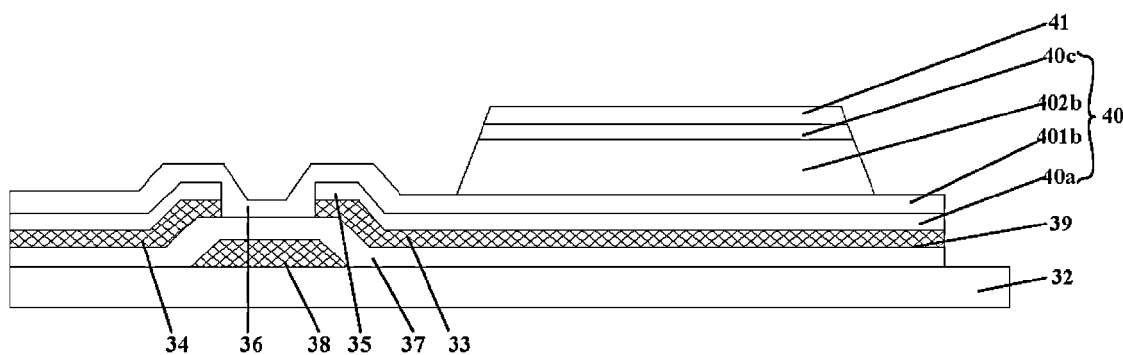
FIG. 5 schematically illustrates a cross section of a sensing element, after a third patterning process, of a sensor in accordance with an embodiment of the invention.

Step 103: a patterning process is used to form a pattern of the active layer 36 disposed on the ohmic layer 35 and in the groove, a pattern of the PD 40 on the receiving electrode 39 and a pattern of the transparent electrode 41 on the PD 40. A cross section after the third patterning process is illustrated in FIG. 5. In the embodiment, the pattern of the transparent electrode 41 may be formed using wet etching or may be formed at the same time with the pattern of the PD 40 using dry etching.

In an embodiment of the method according to the invention, the step may specifically comprise: an active material layer, an I-type semiconductor layer, a P-type semiconductor layer and a transparent electrode layer are sequentially deposited, and a patterning process is used to form the active layer 36, the first part 401b of the I-type semiconductor which is on the N-type semiconductor 40a and in the same pattern layer as the active layer 36, the second part 402b of the I-type semiconductor on the first part 401b of the I-type semiconductor, the P-type semiconductor 40c on the second part 402b of the I-type semiconductor and the transparent electrode 40c on the P-type semiconductor 40c.

In the step, the active material layer and the I-type semiconductor layer are both of the same material a-Si. Thus, the active material layer and the I-type semiconductor layer may be formed in a single deposition. After etching, a part of the active material layer forms the active layer 36 and a part of which forms the first part 401b of the I-type semiconductor. In a PIN semiconductor, the I-type semiconductor is relatively thick and takes up a large part of the depletion layer. Most of the incident light is absorbed in the I-type semiconductor and produces a lot of electron hole pairs. The P-type and N-type semiconductors are both relative thin and absorb only a small amount of the incident light. Since the active layer 36 and the first part 401b of the I-type semiconductor formed at the same time are relatively thin, the second part 402b of the I-type semiconductor is thus needed to adjust the thickness of the whole I-type semiconductor.

Figure 6:
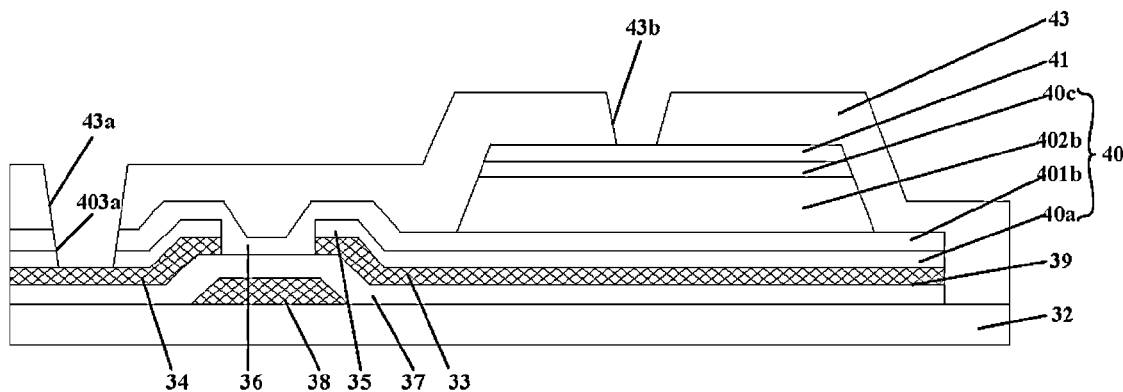
FIG. 6 schematically illustrates a cross section of a sensing element, after a fourth patterning process, of a sensor in accordance with an embodiment of the invention.

Step 104: a patterning process is used to form a pattern of the first passivation layer 43 and a pattern of the third via hole 403a in the active layer 36 and the ohmic layer 35. The first passivation layer 43 has the first via hole 43a over the drain electrode 34 and the second via hole 43b over the transparent electrode 41. The position of the third via hole 403a corresponds to that of the first via hole 43a. A cross section after the fourth patterning process is illustrated in FIG. 6.

Figure 7:
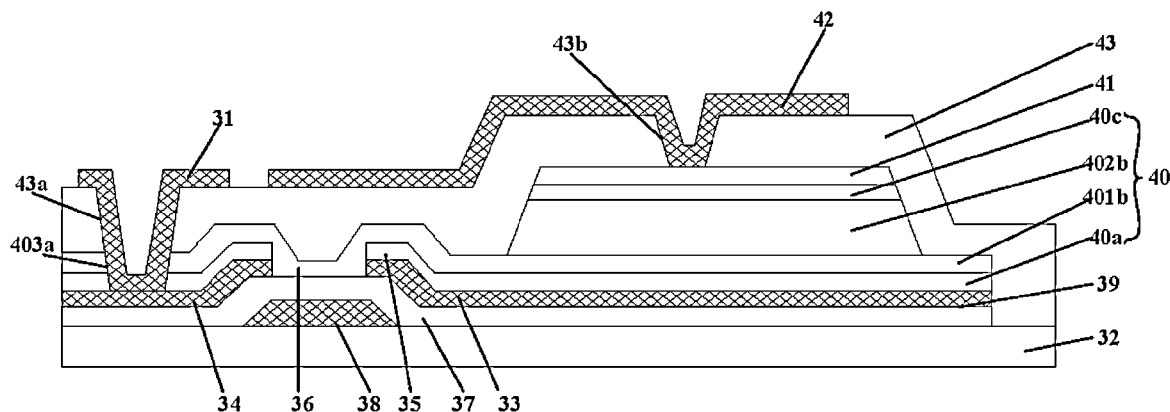
FIG. 7 schematically illustrates a cross section of a sensing element, after a fifth patterning process, of a sensor in accordance with an embodiment of the invention.

Step 105: a patterning process is used to form a pattern of the data line 31 that is positioned on the first passivation layer 43 and connects with the drain electrode 34 through the first via hole 43a and the third via hole 403a, and a pattern of the bias line 42 that is positioned on the first passivation layer 43 and connects with the transparent electrode 41 through the second via hole 43b. In the step, the data line 31 and the bias line 42 are of the same material and may be formed in one deposition. A cross section after the fifth patterning process is illustrated in FIG. 7.

Furthermore, the method may further comprises the following step after step 105:

Step 106: a patterning process is used to form a pattern of the second passivation layer 57 overlaying the base substrate, where the second passivation layer 57 has a signal-transmitting region via hole (located at the peripheral of the substrate and not shown in the figure). A cross section after the sixth patterning process is illustrated in FIG. 2a.

It is seen that the fabrication method for the sensor of the invention uses six patterning processes in total. In comparison with the prior art, it reduces the number of used mask as well as the production cost and simplifies the production process, thereby significantly improving the production capacity and the defect-free rate.

Please note that step 106 is optional, as the invention can still be realized without step 106. Therefore, in an embodiment, the method for fabricating the sensor only comprises the above steps 101 to 105.

What are described above is related to the illustrative embodiments of the disclosure only and not limitative to the scope of the disclosure; the scopes of the disclosure are defined by the accompanying claims.

What is claimed is:

1. A sensor, comprising: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein:

the TFT device comprises: a gate electrode disposed on the base substrate and connected with a gate line; a gate insulating layer disposed on the gate electrode and overlaying the base substrate; a source electrode and a drain electrode disposed on the gate insulating layer and opposed to each other to form a groove, wherein the drain electrode is connected with a data line; an ohmic layer disposed on the source electrode and the drain electrode; and an active layer disposed on the ohmic layer and in the groove;

the photodiode sensing device comprises: a receiving electrode disposed on the gate insulating layer and connected with the source electrode; a photodiode disposed on the receiving electrode; a transparent electrode disposed on the photodiode; and a bias line disposed over the transparent electrode and connected with the transparent electrode, wherein the photodiode is a PIN photodiode comprising: an N-type semiconductor, a first part of an I-type semiconductor, a second part of the I-type semiconductor and a P-type semiconductor, the N-type semiconductor is positioned on the receiving electrode and is in the same pattern layer as the ohmic layer, and the first part of the I-type semiconductor is positioned on the N-type semiconductor and is in the same pattern layer as the active layer.

2. The sensor of claim 1, further comprising:

a first passivation layer disposed on the transparent electrode and overlaying the base substrate, wherein the first passivation layer has a first via hole, the active layer and the ohmic layer have a third via hole positioned corresponding to the first via hole, the first via hole and the third via hole are configured to connect the data line on the first passivation layer with the drain electrode through the first via hole and the third via hole.

3. The sensor of claim 2, wherein the data line is extended and overlays inner walls of the first and the third via holes as well as a part of the drain electrode.

4. The sensor of claim 2, wherein the first passivation layer further comprises a second via hole, which is configured to connect the bias line disposed on the first passivation layer with the transparent electrode through the second via hole.

5. The sensor of claim 4, wherein the bias line is extended and overlays an inner wall of the second via hole and a part of the transparent electrode.

6. The sensor of claim 1, further comprising a second passivation layer disposed on the data line and the bias line and overlaying the base substrate, wherein the second passivation layer has a signal-transmitting region via hole.

7. The sensor of claim 1, wherein
the second part of the I-type semiconductor is positioned on the first part of I-type semiconductor, and the P-type semiconductor is positioned on the second part of the I-type semiconductor.

8. The sensor of claim 1, wherein the source electrode, the drain electrode and the receiving electrode are made of the same material; the data line and the bias line are made of the same material.

9. A method for fabricating a sensor comprising:
forming a pattern of a gate line and a pattern of a gate electrode connected with the gate line on a base substrate, by using a first patterning process;
forming a gate insulating layer overlaying the base substrate, and forming a patter of a source electrode and a drain electrode which are disposed on the gate insulating layer and over the gate electrode and opposed to each other to form a groove, a pattern of a receiving electrode connected with the source electrode, and a pattern of an ohmic layer disposed on the source electrode and the drain electrode, by using a second patterning process;
forming a pattern of an active layer on the ohmic layer and in the groove, a pattern of a photodiode on the receiving electrode and a pattern of a transparent electrode on the photodiode, by using a third patterning process;
forming a pattern of a first passivation layer and a pattern of a third via hole in the active layer and the ohmic layer, by using a fourth patterning process, wherein the first passivation layer has a first via hole over the drain electrode and a second via hole over the transparent electrode, and a position of the third via hole corresponds to that of the first via hole; and
forming a pattern of a data line that is disposed on the first passivation layer and connects with the drain electrode through the first via hole and the third via hole, and a pattern of a bias line that is disposed on the first passivation layer and connects with the transparent electrode through the second via hole, by using a fifth patterning process.

10. The method of claim 9, further comprising the following step after forming the pattern of the data line and the pattern of the bias line:
forming a pattern of a second passivation layer overlaying the base substrate by using a sixth patterning process, wherein the second passivation layer has a signal-transmitting region via hole.

11. The method of claim 9, wherein the data line is extended and overlays inner walls of the first via hole and the third via hole as well as a part of the drain electrode.

12. The method of claim 9, wherein the bias line is extended and overlays an inner wall of the second via hole and a part of the transparent electrode.

13. The method of claim 9, wherein the photodiode is a PIN photodiode comprising: an N-type semiconductor, a first part of an I-type semiconductor, a second part of the I-type semiconductor and a P-type semiconductor, wherein the step of forming the pattern of the source electrode and the drain electrode, the pattern of the receiving electrode and the pattern of the ohmic layer by using the second patterning process further comprises: forming a pattern of the N-type semiconductor disposed on the receiving electrode and in the same pattern layer as the ohmic layer.

14. The method of claim 13, wherein the step of forming the patterning of the active layer, the pattern of the photodiode and the pattern of the transparent electrode by using a third patterning process comprises:
sequentially depositing an active material layer, an I-type semiconductor layer, a P-type semiconductor layer and a transparent electrode layer, and forming the active layer, the first part of the I-type semiconductor which is disposed on the N-type semiconductor and in the same pattern layer as the active layer, the second part of the I-type semiconductor on the first part of the I-type semiconductor, the P-type semiconductor on the second part of the I-type semiconductor and the transparent electrode on the P-type semiconductor, by using a single patterning process.

15. The method of claim 9, wherein the source electrode, the drain electrode and the receiving electrode are made of the same material; the data line and the bias line are made of the same material.

16. The sensor of claim 3, wherein the first passivation layer further comprises a second via hole, which is configured to connect the bias line disposed on the first passivation layer with the transparent electrode through the second via hole.

17. The sensor of claim 2, wherein
the second part of the I-type semiconductor is positioned on the first part of I-type semiconductor, and the P-type semiconductor is positioned on the second part of the I-type semiconductor.

18. The sensor of claim 3, wherein
the second part of the I-type semiconductor is positioned on the first part of I-type semiconductor, and the P-type semiconductor is positioned on the second part of the I-type semiconductor.

19. The sensor of claim 4,
the second part of the I-type semiconductor is positioned on the first part of I-type semiconductor, and the P-type semiconductor is positioned on the second part of the I-type semiconductor.

20. The sensor of claim 5,
the second part of the I-type semiconductor is positioned on the first part of I-type semiconductor, and the P-type semiconductor is positioned on the second part of the I-type semiconductor.

* * * * *